United States Patent [19]
Smayling et al.

[11] Patent Number: 5,242,841
[45] Date of Patent: Sep. 7, 1993

[54] METHOD OF MAKING LDMOS TRANSISTOR WITH SELF-ALIGNED SOURCE/BACKGATE AND PHOTO-ALIGNED GATE

[75] Inventors: Michael C. Smayling, Missouri City, Arlene K. Torreno, Executrix; Manuel L. Torreno, Jr. deceased, late of Houston, both of Tex.; George Falessi, Villeneuve-Loubet, France

[73] Assignee: Texas Instruments Incorporated, Dallas, Tex.

[21] Appl. No.: 857,360

[22] Filed: Mar. 25, 1992

[51] Int. Cl.⁵ .................................. H01L 21/70
[52] U.S. Cl. ............................ 437/29; 437/27; 437/40; 437/44; 437/151; 148/DIG. 151
[58] Field of Search ............ 437/27, 29, 40, 41, 437/44, 150, 151, 152, 153, 154, 26, 933; 357/23.4, 23.8; 148/DIG. 151

[56] References Cited

U.S. PATENT DOCUMENTS

| | | | |
|---|---|---|---|
| 3,919,007 | 11/1975 | Tanui et al. | 148/DIG. 151 |
| 4,038,107 | 7/1977 | Mann et al. | 437/933 |
| 4,072,636 | 2/1990 | Akiyama et al. | 437/40 |
| 4,705,759 | 11/1987 | Lidow et al. | 437/29 |
| 4,912,541 | 3/1990 | Baliga et al. | 357/23.4 |
| 4,914,047 | 4/1990 | Selci | 437/29 |
| 5,045,902 | 9/1991 | Bamcal | 437/40 |
| 5,047,358 | 10/1991 | Kosiak et al. | 437/44 |

FOREIGN PATENT DOCUMENTS

0069122  4/1986  Japan .

*Primary Examiner*—Tom Thomas
*Attorney, Agent, or Firm*—Mark A. Valetti; James C. Kesterson; Richard L. Donaldson

[57] ABSTRACT

An embodiment of the present invention is a method of fabricating power and non-power devices on a semiconductor substrate, the method comprising: forming alignment marks in the substrate (100); introducing a dopant of a first conductivity type into the substrate to form high-voltage tank regions (103); annealing the dopants (105); introducing dopants of the first conductivity type and a second conductivity type in a region in the high-voltage tank region (109); annealing the dopants of the first and the second conductivity type to form a second region within a third region, both within the high-voltage tank region, due to the different rates of diffusion of the dopants (110); and forming gate structures after the annealing of the dopants of the first and second conductivity types (122).

16 Claims, 17 Drawing Sheets

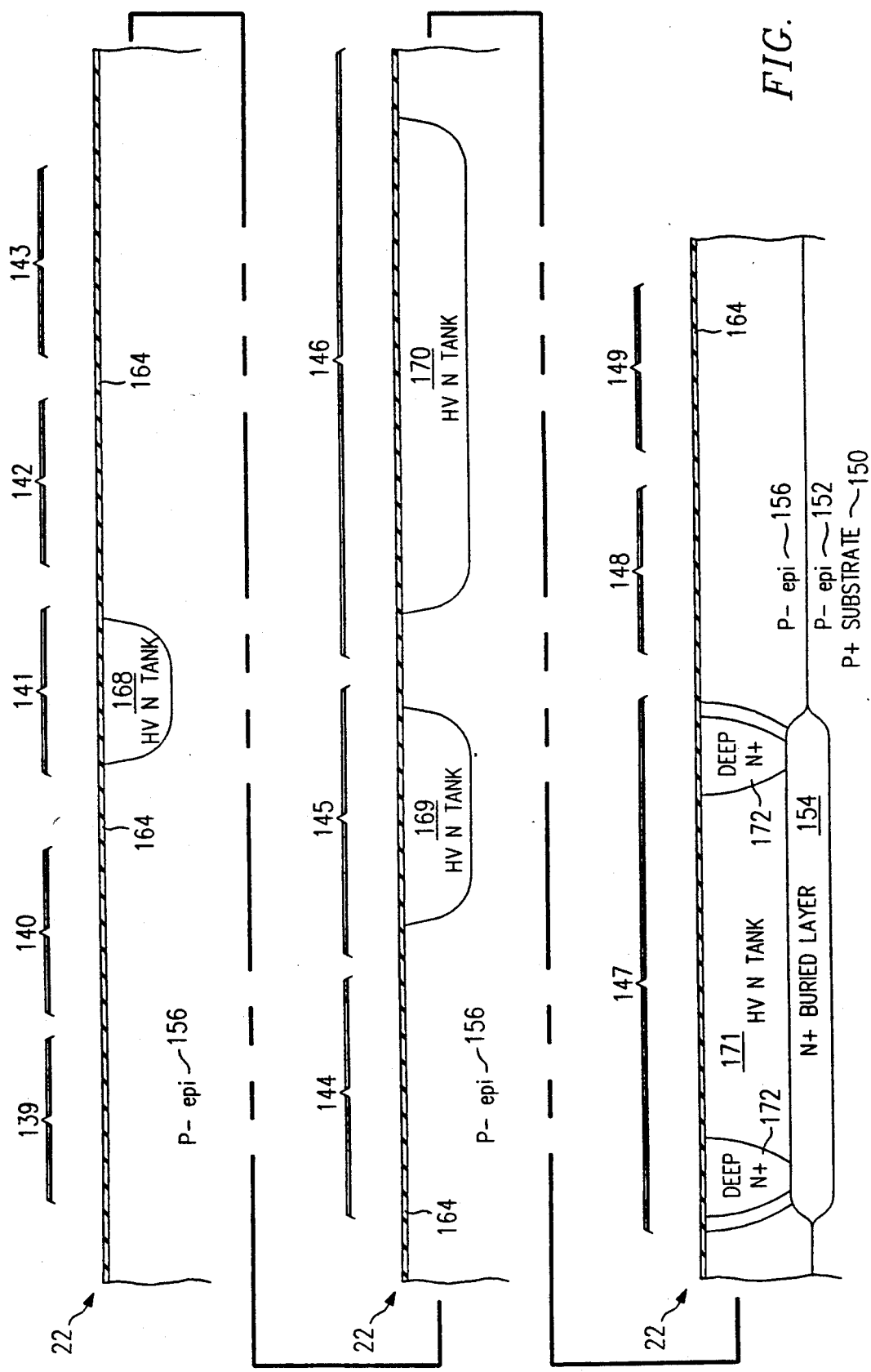

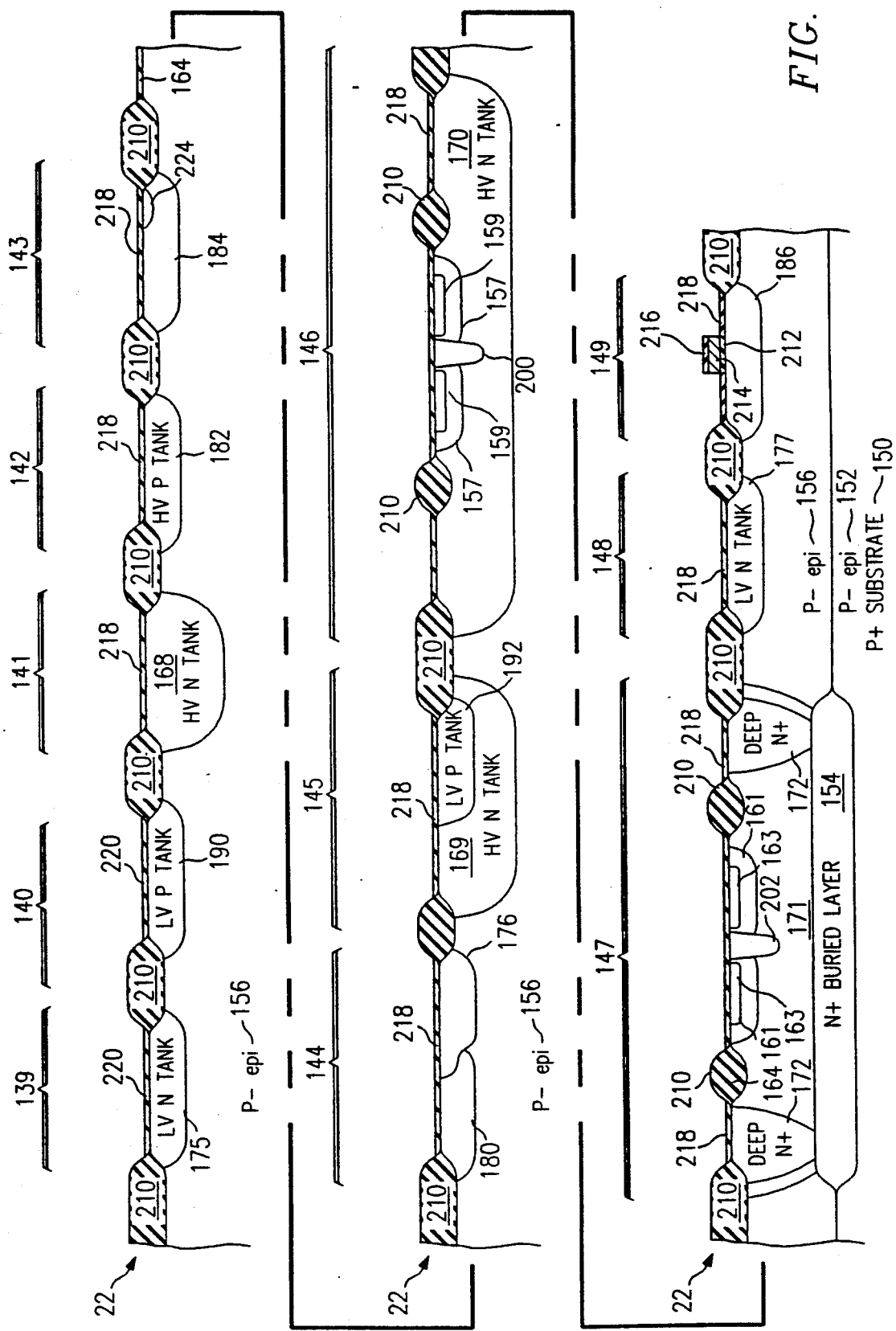

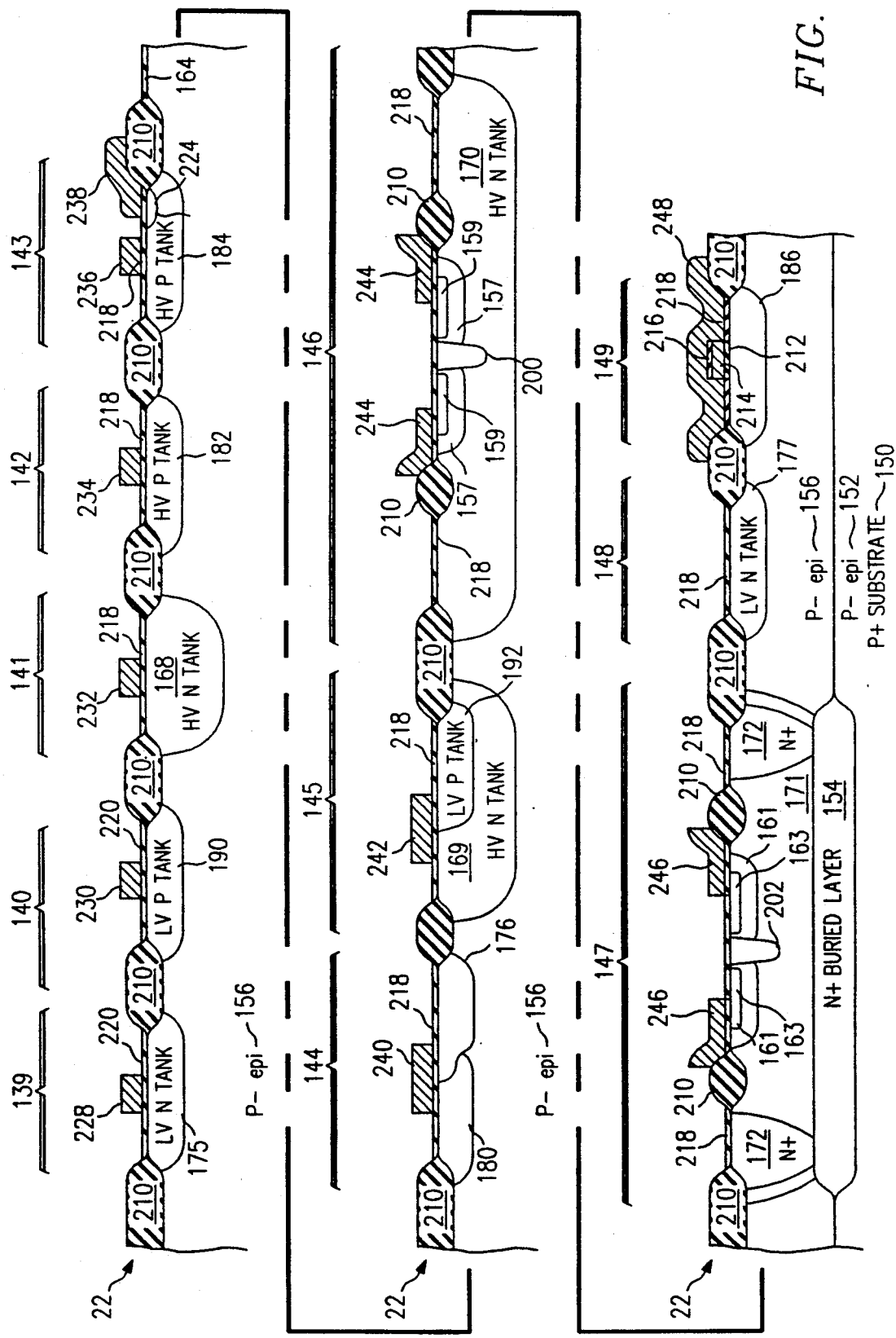

METHOD OF MAKING LDMOS TRANSISTOR WITH SELF-ALIGNED SOURCE/BACKGATE AND PHOTO-ALIGNED GATE

CROSS-REFERENCE TO RELATED APPLICATIONS

The following coassigned patent applications are hereby incorporated herein by reference:

| Serial No. | Filing Date | TI Case No. |
| --- | --- | --- |
| 857,533 | 3-25-92 | TI-16227 |

TECHNICAL FIELD OF THE INVENTION

The present invention is in the field of semiconductor processing.

BACKGROUND OF THE INVENTION

In many applications it is desirable to have a variety of logic devices, memory devices, and devices capable of withstanding large transients (hereon referred to as power devices) all on a single substrate. One such type of power device is a double-diffused metal-oxide-semiconductor transistor (DMOS).

Heretofore most lateral double-diffused "metal" oxide semiconductor, LDMOS, structures built on a substrate with one or more other device structures were formed by first forming a high-voltage tank. After formation of the high-voltage tank, a second low-voltage tank (typically used as the backgate), of opposite conductivity type to that of the first tank, was formed within the first high-voltage tank, and active regions and gates were aligned to these tanks. The alignment of these to other existing structures is difficult.

Purely self-aligned LDMOS transistors cannot be easily integrated because a level of polysilicon is required early in the process. A purely photo-aligned device is difficult to control because the backgate leaves no marks for alignment, and channel length is alignment dependent.

It is, therefore, an object of the invention to form source/channel regions that are self-aligned and formed prior to the formation of the gate. It is a further object of the invention to perform a majority of the high-temperature process early in the process flow. Further objects and advantages of the invention will become apparent to those of ordinary skill in the art having reference to the following specification together with the drawings.

SUMMARY OF THE INVENTION

One aspect of the present invention is a process flow which can be used to fabricate power and non-power devices on a single substrate while maintaining superior performance. More specifically, the process flow of the present invention was created to enhance the performance of the power devices, and at the same time reduce the number of process steps by incorporating the process steps used to enhance the performance of the power devices to fabricate the non-power devices, without degrading their performance. Another aspect of the present invention is a process used to fabricate power devices and non-power devices in which the channel length of the devices is defined by the different diffusion rates of the dopants used to form the channel and surrounding tank structures.

An embodiment of the present invention is a method of forming a device on a semiconductor substrate. The method comprises the steps of: selectively forming a first region of a first conductivity type, preferably n-type, in the semiconductor substrate; subjecting the substrate to a first substantially elevated temperature, preferably after forming said first region; introducing dopants, preferably by implantation, of the first conductivity type and a second conductivity type, preferably p-type, into a region in the first region, the dopants having different diffusion rates; subjecting the substrate to a second substantially elevated temperature thereby forming a second region within a third region, both within the first region, due to the different diffusion rates of the dopants; forming field oxide; forming a gate structure after the selectively forming the second region; and forming source/drain regions aligned to the field oxide, the gate structure, or both.

Another embodiment of the present invention is a method of fabricating power and non-power devices on a semiconductor substrate, the method comprising: forming alignment marks in the substrate; introducing a dopant of a first conductivity type into the substrate to form high-voltage tank regions; annealing the dopants; introducing dopants of the first conductivity type and a second conductivity type in a region in the high-voltage tank region; annealing the dopants of the first and the second conductivity type to form a second region within a third region, both within the high-voltage tank region, due to the different rates of diffusion of the dopants; and forming gate structures after the annealing of the dopants of the first and second conductivity types.

A third embodiment of the present invention is a method of making a LDMOS transistor, comprising the steps of: forming a DWELL region, preferably by first introducing dopants of opposite conductivity types into the high voltage tank region using the single mask and then annealing the dopants of opposite conductivity type thereby forming a first doped well within a second oppositely doped well, in a high voltage tank region of a LDMOS transistor by using a single mask; and forming a gate for the LDMOS transistor after forming the DWELL region.

A fourth embodiment is a method of fabricating power and non-power devices on a semiconductor substrate of a first conductivity type, the method comprising: introducing dopant of a second conductivity type opposite the first conductivity type into the substrate to form high-voltage tank regions; annealing the dopants used to form high-voltage tank regions; introducing dopant of a second conductivity type into the substrate to form low-voltage tank regions; introducing dopant of a first conductivity type into the substrate to form high-voltage tank regions; introducing dopant of a first conductivity type into the substrate to form low-voltage tank regions; introducing dopants of the first conductivity type and a second conductivity type in a region in the high-voltage tank region of the second conductivity type to form a dwell; annealing the dopants of the first and the second conductivity type used to form high-voltage tank regions, low-voltage tank regions, and the dwell, and wherein the first and second conductivity type dopants used to form the dwell form a first dwell region within a second dwell region, both within the high-voltage tank region formed of a second conductivity type, due to the different rates of diffusion of the dopants; forming thick gate insulating layer on portions of the substrate overlying the high-voltage tank regions of the first and second conductivity types and the first and second dwell regions; forming thin gate insulating layer on portions of the substrate overlying the low-voltage tank regions of the first and second conductivity types; forming gate structures on the thick and thin gate insulating layers; and forming source/drain regions in the substrate aligned to at least one edge of the gate structures.

BRIEF DESCRIPTION OF THE DRAWINGS

The present invention is described in conjunction with the accompanying drawings, in which:

FIGS. 2a-2k are highly magnified sectional views of different portions of an integrated circuit manufactured in accordance with the process flow of FIG. 1, showing successive stages in the fabrication thereof;

DETAILED DESCRIPTION OF THE PREFERRED EMBODIMENT

Integrated Process

Figure 1:
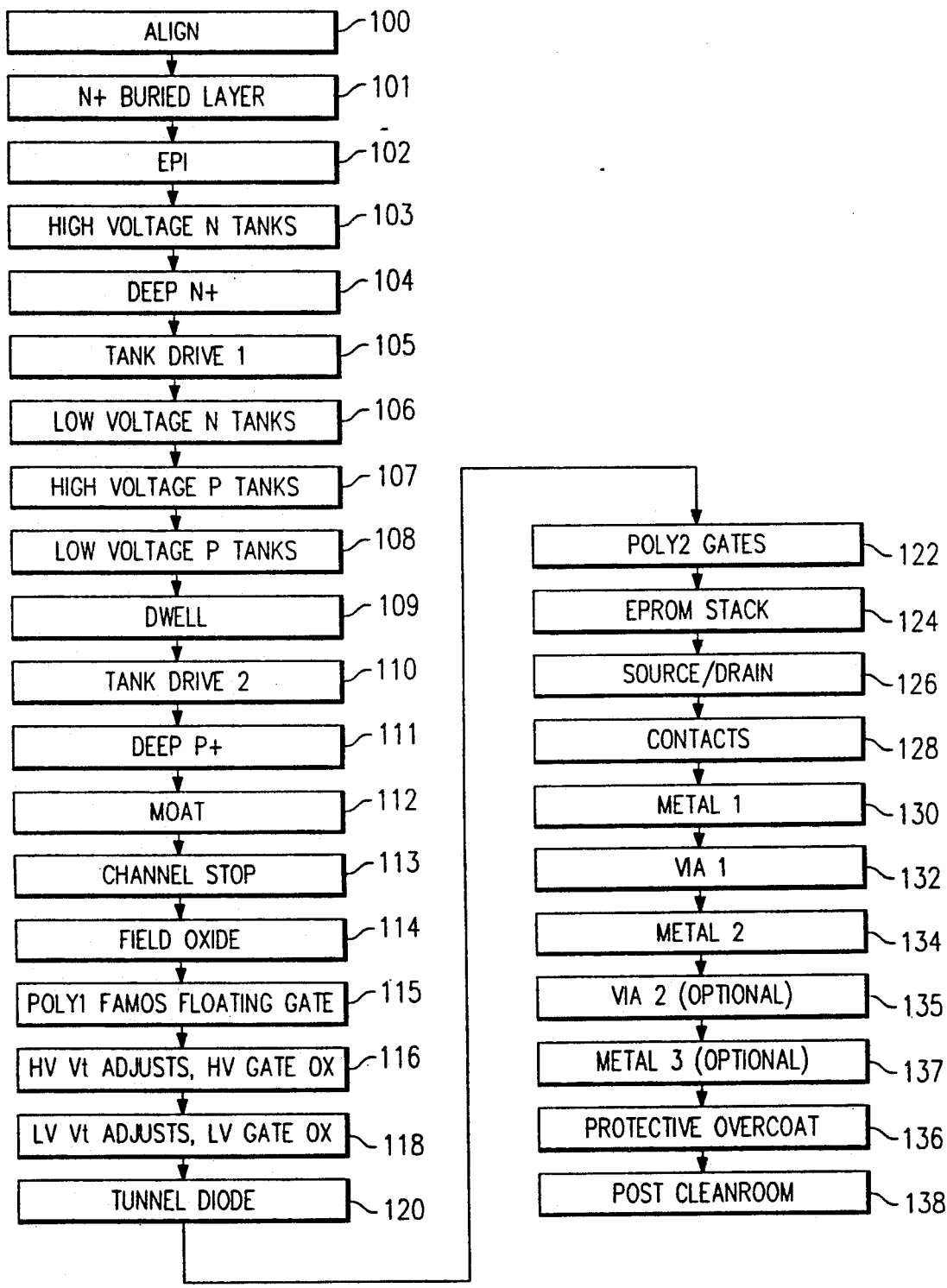
FIG. 1 is a high level semiconductor process flow diagram.
Figure 2B:
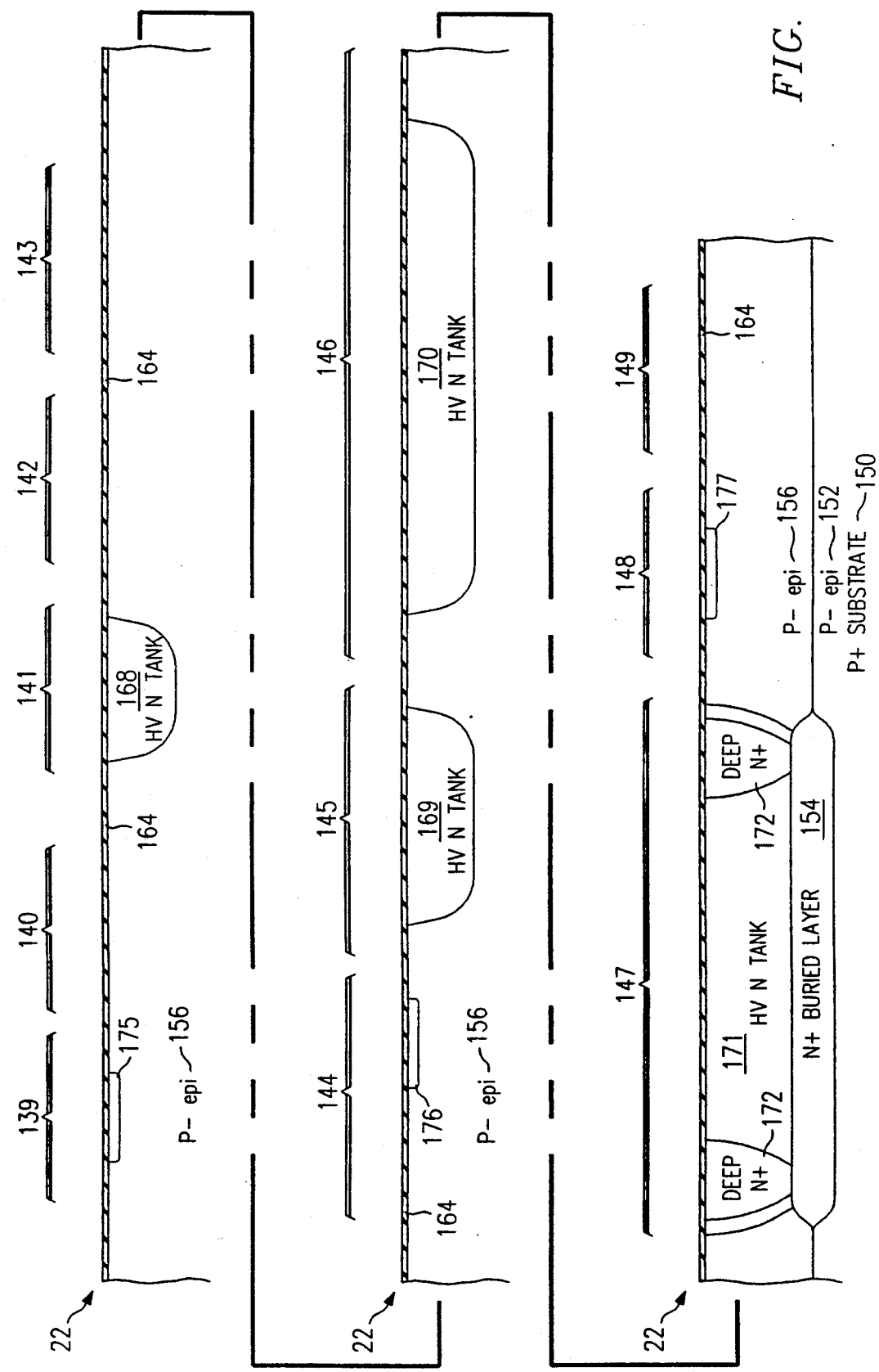
Figure 2C:
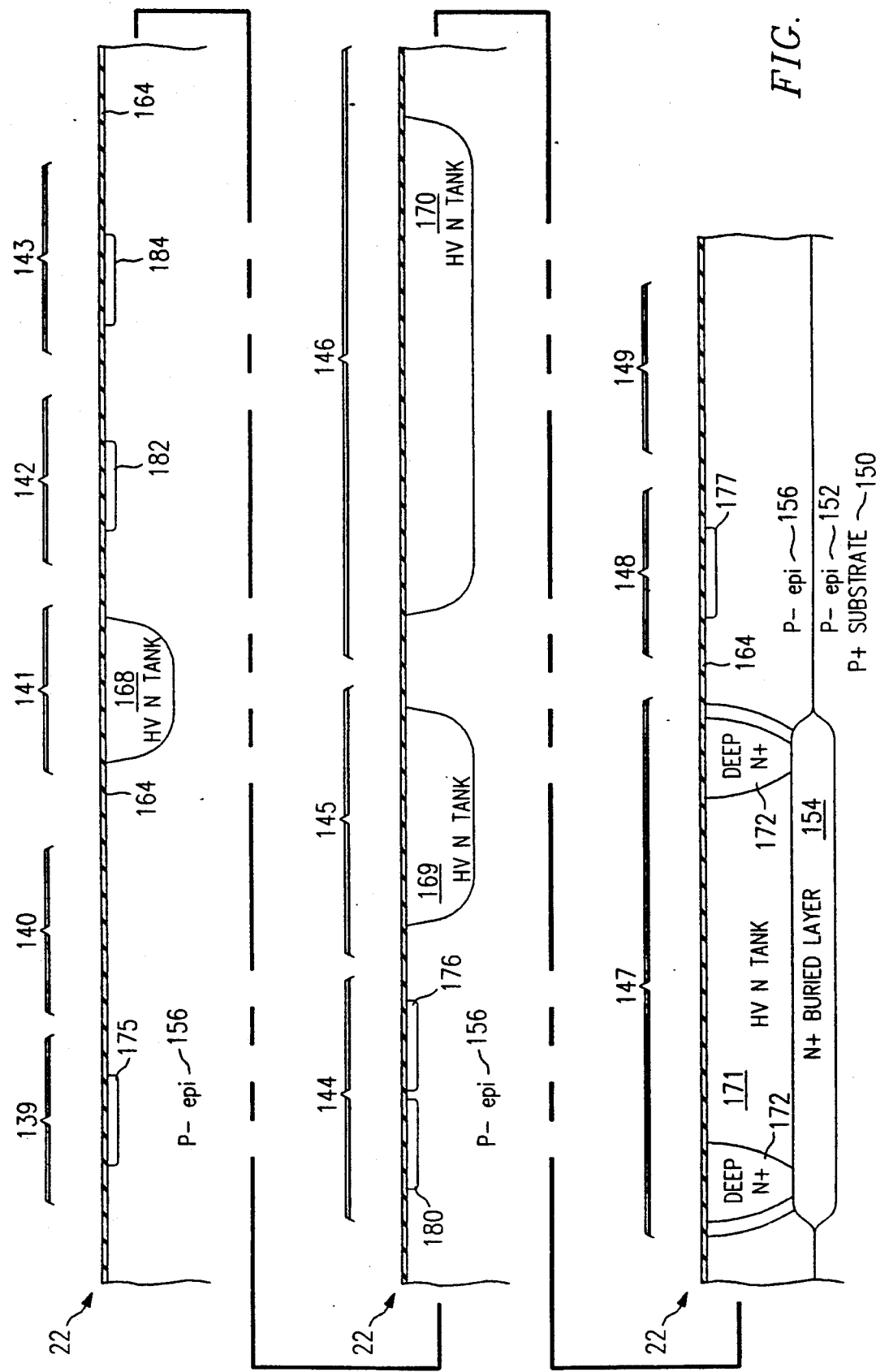
Figure 2D:
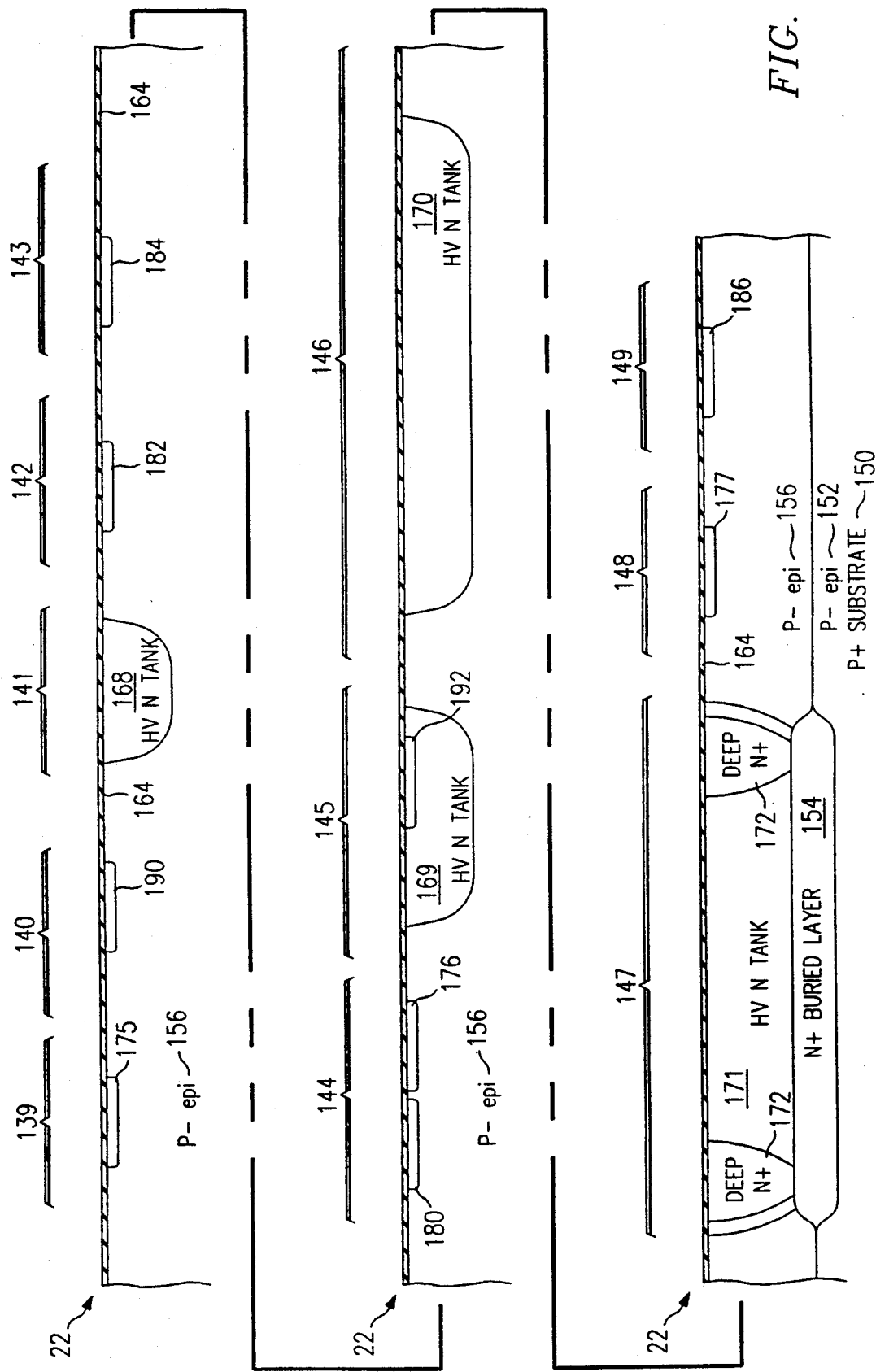
Figure 2E:
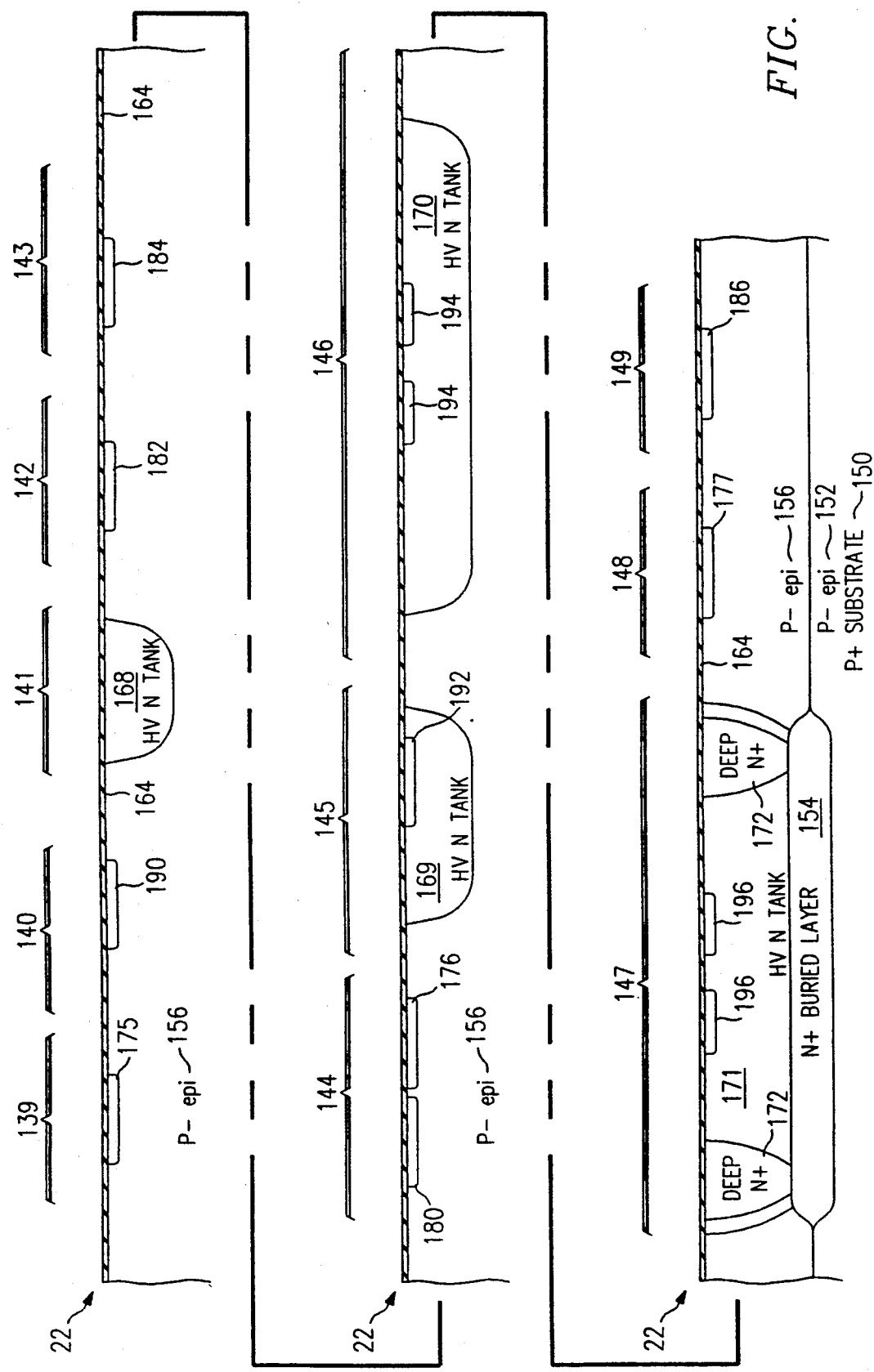
Figure 2F:
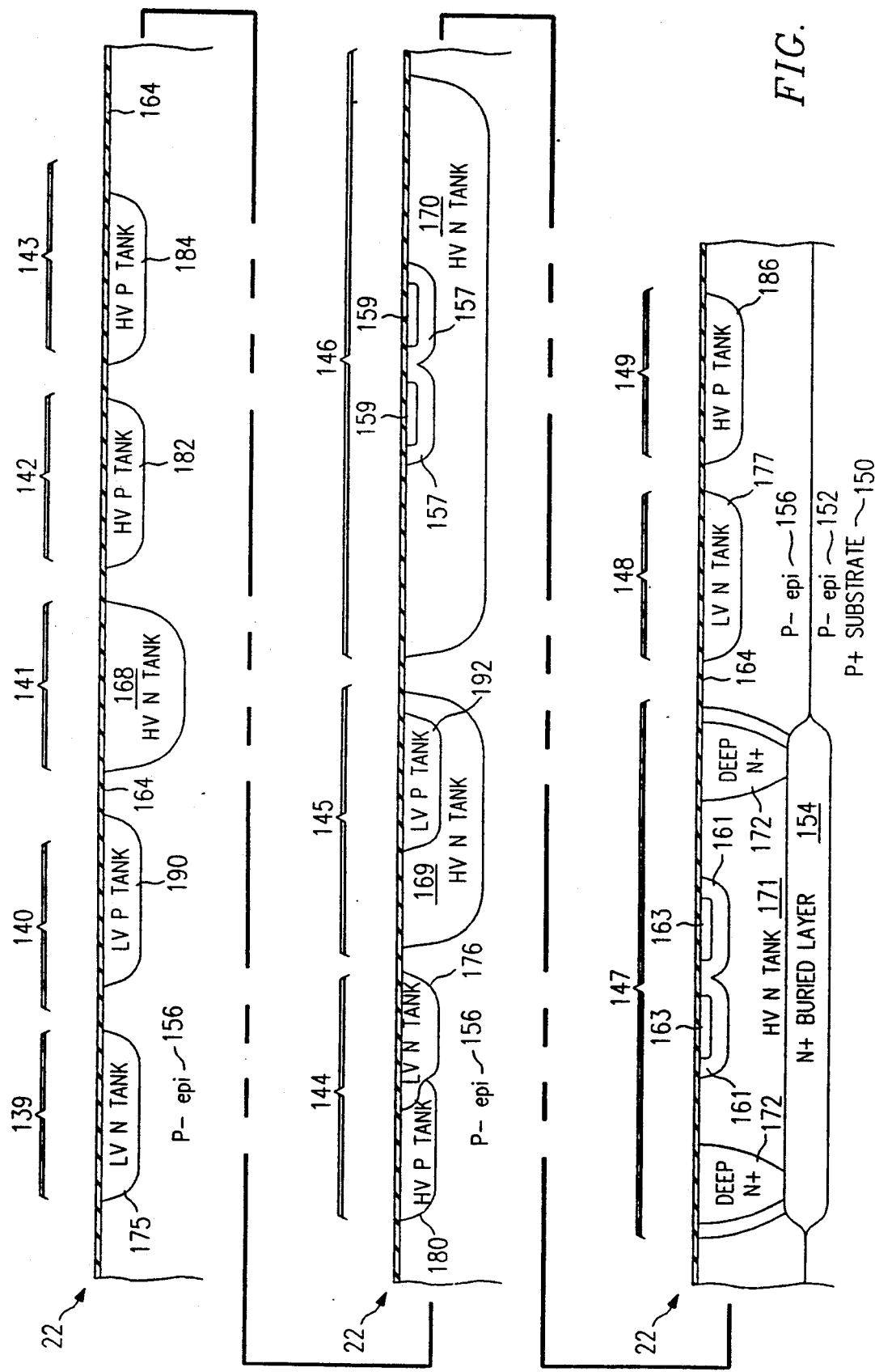
Figure 2G:
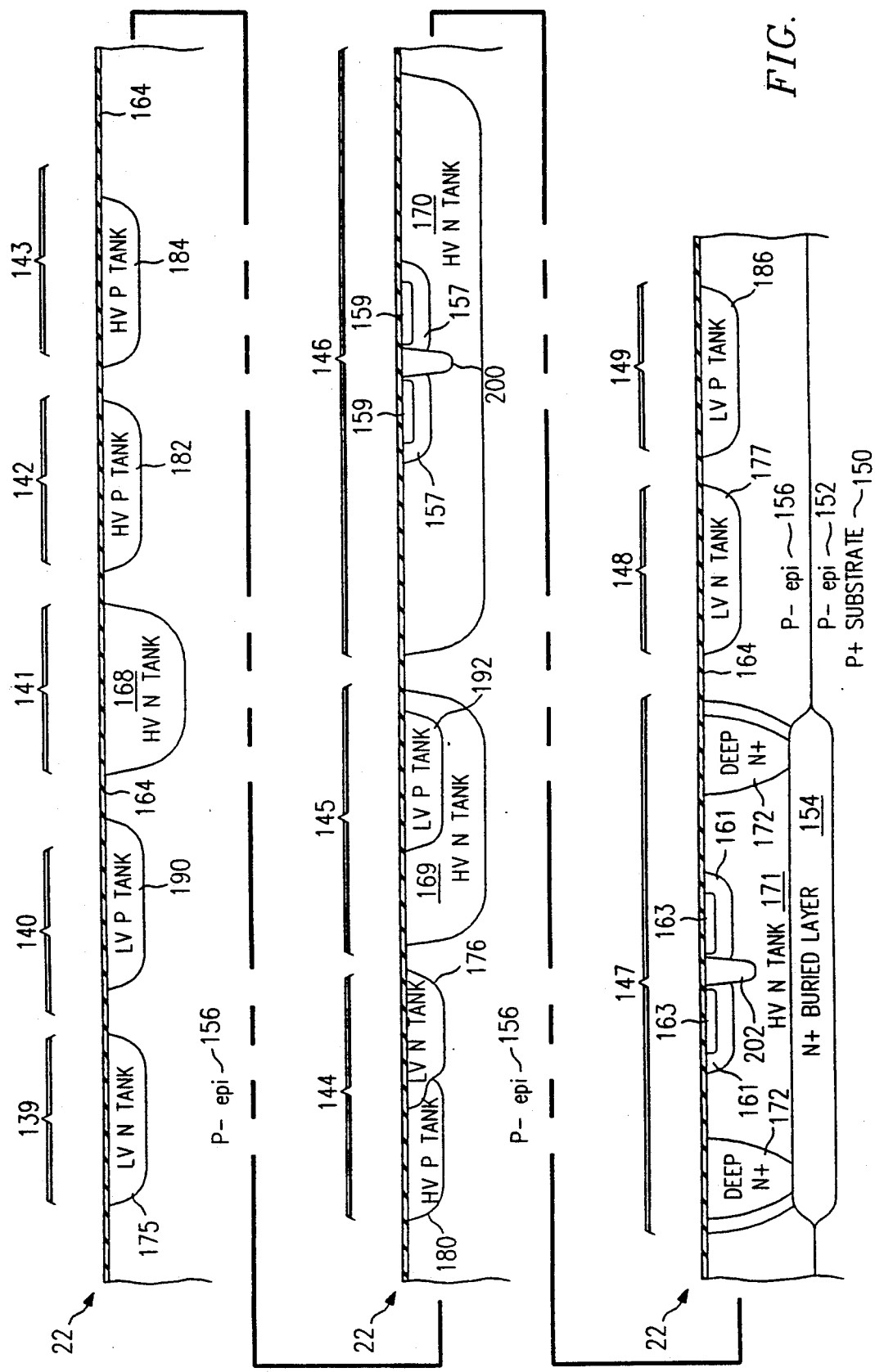
Figure 2H:
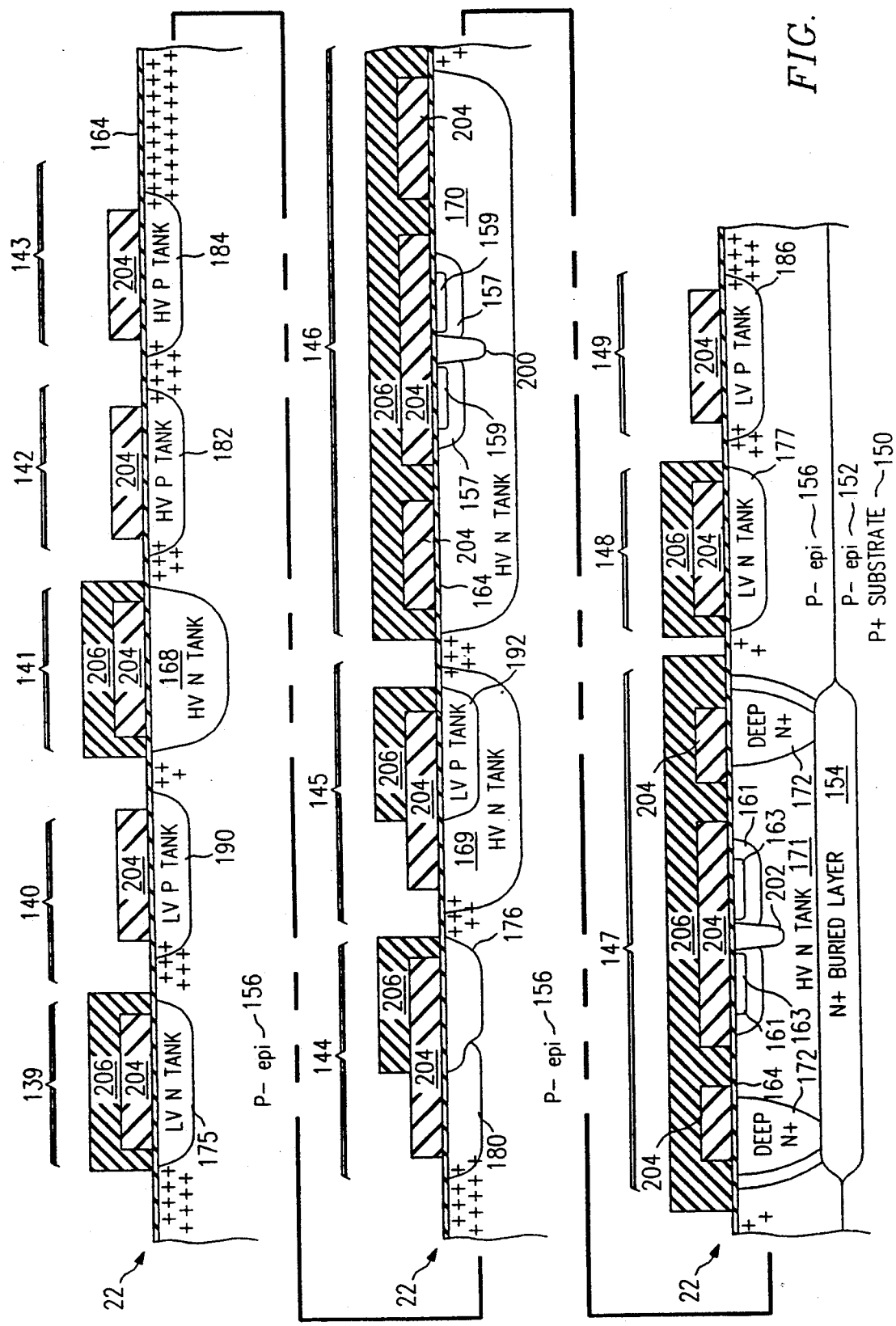
Figure 2K:
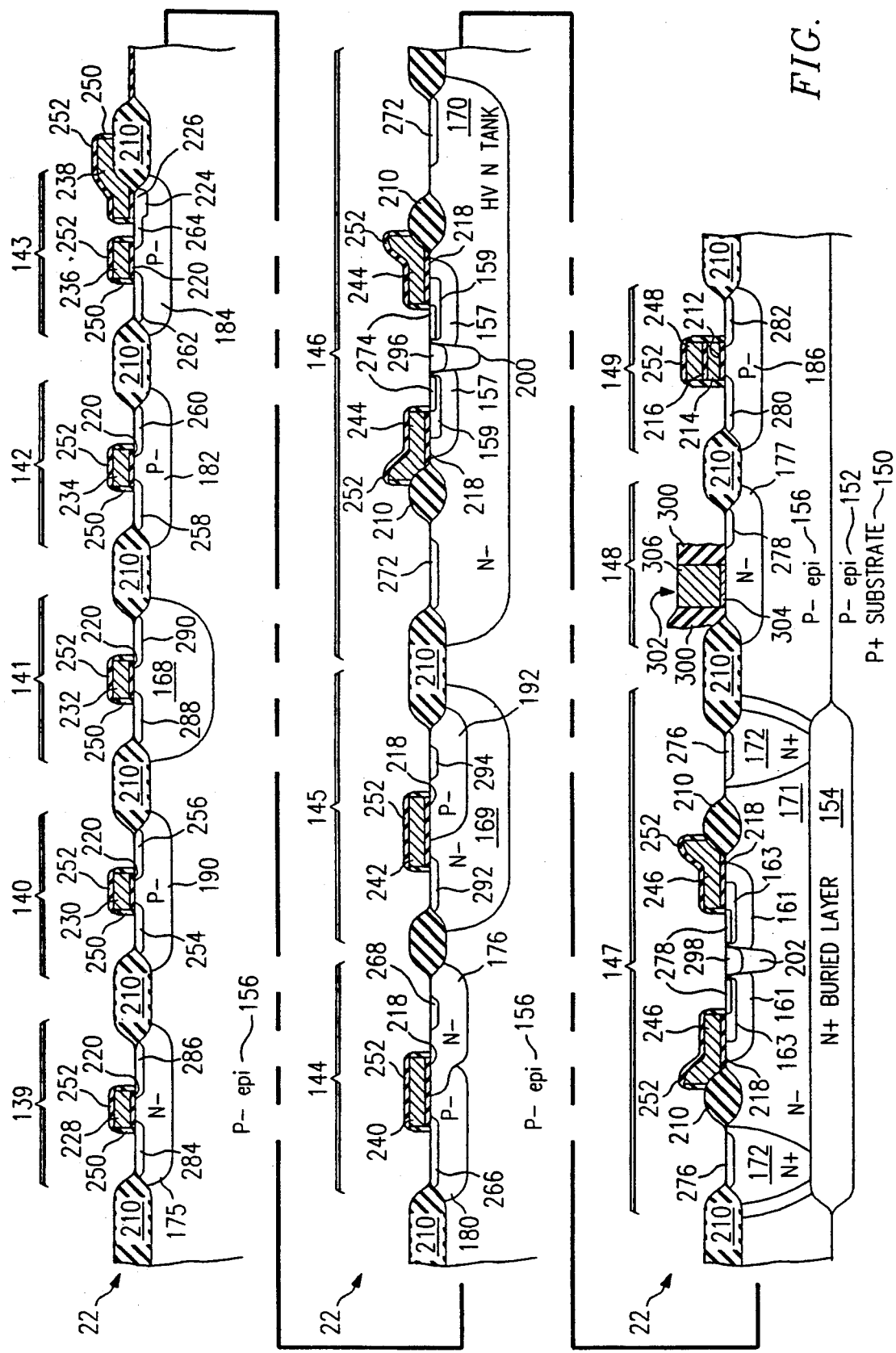

FIG. 1 is a process flowchart that gives an overview of a novel process used in fabricating an integrated circuit. Before discussing specific steps of the process, some of its advantages are described.

Among the advantages provided, the process shown in FIG. 1 is modular: where particular devices are not required, some of the process steps shown in FIG. 1 may be omitted. For example, if an integrated circuit does not require EEPROM cells, then a tunnel diode step 120 would be left out. If the particular chip to be fabricated does not require power transistors having buried drain regions or collectors, then a (n+) buried layer step 101, an EPI step 102, and a deep (n+) step 104 may be omitted. If the device does not require FAMOS EPROM cells, a FAMOS floating gate step 115 and a EPROM stack step 124 may be omitted. Additions to the process can be made as well for modifications of illustrated cells, as will be explained hereafter.

In addition to the modular nature of the process shown in FIG. 1, it also includes process steps at the beginning of the process flow which are typically performed at the end of the process flow. An advantage of this is that key parameters of the invention, such as channel length, are defined by the diffusion rate of the dopants and not by the placement of the tank with respect to a specific structure.

The inventive process provides a unified set of process parameters that can be applied to distinctly different devices. This allows design rules for the different devices to be stored in a library. An integrated circuit designer may select different devices from this library with the assurance that a process is available for building them, and that the devices so selected are compatible with this process. This considerably reduces design time for chips having new designs.

The semiconductor process flow of FIG. 1 additionally allows both power devices, devices typically supplied with unregulated power supplies and capable of withstanding transients as high as 60 volts, and non-power devices, devices typically subjected to lower transients, to be fabricated on the same semiconductor chip with a minimum number of process steps and a minimum number of masks. The process flow is arranged to provide minimum amounts of heat cycling to each of the completed devices on the chip. By placing high temperature steps generally at the beginning of the process, later formed device structures are less likely to be damaged.

Turning now to a description of the process, it is to be noted that while the inventive process of FIG. 1 is described in conjunction with the fabrication of devices in a (p) type silicon substrate and epitaxial layers, the process has application to (n) type semiconductor materials and to other semiconductors. Since the process provides a unified set of process parameters that can be applied to distinctly different devices, the overall process is first discussed generically without reference to making a specific device. Accordingly, no cross-sectional drawings are provided for this discussion. Table 1, described later, and the cross-sectional FIGS. 2-6 relate the process to specific device types.

In FIG. 1, alignment marks are formed by etching targets into the a p-type semiconductor substrate in ALIGN step 100. The alignment marks define regions within the semiconductor substrate where device types may be formed, and are preferably used to align most of the masks used to form high-voltage and low-voltage tanks. For example, the alignment marks may designate low power CMOS regions and high power LDMOS regions. Next, process step 101 forms a (p−) epitaxial silicon layer and selectively creates an (n+) buried layer in the p-type epitaxial silicon layer. The (n+) buried layer may be used as the drain for vertical double diffused "metal oxide semiconductor (VDMOS) n-channel power transistors. A buried (n+) layer is also used as the collector for a vertical npn bipolar transistor, as will be later described. A laterally separate (n+) buried layer may be created for each VDMOS transistor, or one such layer may be used for several such transistors if these are intended to be connected in parallel. The buried (n+) layer, combined with deep (n+) diffusions, can form isolated NMOS transistors and (p+) resistors.

The (n+) buried layer is covered in step 102 by a layer of epitaxial (p−) silicon of a thickness suitable to allow subsequent thermal processing. The (n+) buried layer is thus positioned between two (p−) epitaxial layers. After creating the (n+) buried layer, step 103 fabricates (n−) transistor tanks for the high voltage power transistors. These tanks are large diffused regions in which the power transistors are fabricated. One technical advantage of the invention is that the same implantation used to create the high-voltage tanks for the power transistors are used to create tanks for other devices, such as n-channel 18-volt EEPROM gating transistors. Forming the power transistors in tanks isolates the sources from the substrate, allowing high-side driver circuit configurations. A high side driver configuration consists of the LDMOS transistor drain coupled to circuitry or a power supply and the source coupled to an output load.

At step 104, a deep (n+) implant occurs in order to connect the (n+) buried layers to surface contacts for the vertical transistors. The (n−) high voltage diffusion and deep (n+) implants are annealed at high temperature in TANK DRIVE step 105.

Steps 101, 102, and 104 may be skipped if associated structures are not required for a given IC design.

At step 106, low-voltage device (n−) tanks are created to enclose conventional low-voltage ($V_{dd} \leq 14$ volts) logic field effect transistors, and components of, for example, vertical and lateral DMOS n-channel power transistors, and drain-extended n-channel power transistors. Low-voltage n-tanks are also used to enclose Schottky diodes. The high and low-voltage tanks described herein differ in the dopant concentrations used to create them, and are thus implanted into the chip at different times. The high voltage tanks are formed with a lower dopant concentration to preserve a high pn junction diode breakdown, but are deeper. The low-voltage tanks are shallower, but have a higher concentration of dopant.

At step 107, a plurality of high-voltage p-tanks are created in the epitaxial layer. The high-voltage p-tanks are used as tanks for devices such as 18 volt EEPROM gating transistors, EEPROM cells, and drain extended n-channel transistors. Step 108 involves the fabrication of low-voltage p-tanks as, for example, enclosures for low-voltage n-channel field effect logic transistors, as drains for extended drain p-channel field effect transistors, and as tanks for floating gate avalanche injection electrically programmable read-only memory (FAMOS EPROM) cells.

At step 109, one or more DWELL regions are masked and implanted to form self-aligned (p−) and (n+) diffusions. The (p−) portion of the DWELL is preferably formed by implanting boron into the exposed portion of the epitaxial layer, and the (n+) portion of the DWELL is preferably formed by implanting arsenic into the same exposed portion of the epitaxial layer. The mask used to define the DWELL regions is preferably aligned using the alignment marks formed in ALIGN step 100. The DWELL regions serve as backgate and source of lateral DMOS and vertical DMOS transistors, as the base and emitter of vertical NPN transistors, and as the anode and cathode of zener diodes.

At step 110, all tank/well dopants are diffused to nearly final depths by a high temperature operation.

At step 111, deep (p+) implantations are performed, for example, to form deep back gates for lateral and vertical DMOS n-channel power transistors. This step can be omitted if deep (p+) implantations are not needed.

At step 112, moat or isolating oxide regions surrounding active device areas are defined with a mask. Channel stop implants that further isolate the devices from each other are carried out at step 113 in selected (p−) regions, with self-alignment to the active device areas. In step 114, the previously defined isolating regions have oxide grown on the face of the semiconductor epitaxial layer.

Step 115 concerns growing a first gate oxide and the subsequent formation of a first-level polycrystalline silicon (poly 1) conductor. For example, floating gate avalanche injection "metal" oxide semiconductor (FAMOS) EPROM cell, double-level poly EEPROM cells, and poly-poly capacitors use first level polycrystalline silicon conductors.

Next, at step 116, the gate oxide for the control gates of the high-voltage and high power transistors is grown and threshold voltage $V_t$ adjust implants are performed for these transistors. The $V_t$ adjust forms a (p−) region at the surface of the DMOS transistors, self-aligned to active areas by the field oxide.

At step 118, similar low-voltage $V_t$ adjust implants are performed through the high-voltage gate oxide layer. For the low voltage transistors, the relatively thick high voltage gate oxide is removed and a thin gate oxide is thermally grown.

Step 120 concerns a portion of the EEPROM cell fabrication, and includes an (n+) Fowler-Nordheim tunnel diode implant and the formation of a thin tunnel oxide over the implant.

At step 122, a second-level polysilicon (POLY 2) layer is deposited, doped, patterned and etched to define gates for low- and high-voltage field effect transistors, single-level poly EEPROM cells, and to partially or completely define the control gate for FAMOS n-channel EPROM cells, double-level poly EEPROM cells and poly-poly capacitors.

At step 124, a patterning and etching of certain double-level poly gate stacks occurs to complete the definition of the FAMOS n-channel EPROM cell control gates and floating gates, and, in one embodiment, stack-etched EEPROM cells. EPROM (n+) cell implants can be done with the stack pattern.

In step 126, several source/drain implants and diffusions occur. The polysilicon transistor and memory cell gates have sidewall oxides formed adjacent their lateral edges and cap oxides on other exposed polysilicon surfaces. A lightly doped drain (LDD) (n) type implant is made into the surface source/drain regions of the n-channel field effect transistors immediately before a main (n+) source/drain implantation. The LDD and (n+) implantations are annealed, followed by (p+) source/drain patterning and implantation. The n-type source/drain implantation step is further used to form surface contact regions for back gates for p-channel transistors, and the (p+) source/drain implantation step is further used to form surface contact regions for back gates for n-channel transistors.

In step 128, the formation of the semiconductor portions of the fabricated devices is essentially complete and all that is left is the conductive interconnection of these devices with each other and to the outside world, with the exception of Schottky diode devices. An oxide is deposited in step 128 and is patterned and etched to produce contact windows.

At step 130, platinum is deposited and PtSi formed at contacts and Schottky diodes. Next, the first level of metal is deposited, patterned and etched. At step 132, a second-level of insulator is deposited over the first metal and vias are formed to the first metal. The second metal itself is deposited, patterned and etched at step 134. The sequence of depositing an insulator, forming vias, and forming metal interconnect can be continued as illustrated by steps 135 and 137. A protective overcoat is added at 136, and various post-clean room processes are performed on the chip at step 138.

FIGS. 2-7 relate the inventive process to particular device types. Structures which have similar appearance in the drawings retain the same reference number. For example, the field oxide regions shown in each of the figures is labeled reference numeral 210. Structures formed in the same process step but having different appearances are given different reference numbers. For example, compare the gate 244 in FIG. 2k to the gate 352 in FIG. 3a. Table 1 provides a map by which process steps of FIG. 1 are related to FIGS. 2-7. For example, process step 101 forms an (n+) buried layer. In FIGS. 2a-2k, this layer has reference number 154; it is formed in vertical double-diffused "metal" oxide semiconductor (VDMOS) transistor 147. In FIGS. 4a-4b an (n+) buried layer has reference number 402 while in FIGS. 6a-6b it has reference number 602.

TABLE 1

| Structure | Figure Number | Device | Ref. Number | Process Step |
|---|---|---|---|---|
| (n+) Buried Layer | 2a-2k | 147 | 154 | 101 |
| | 4a-4b | 400 | 402 | |
| | 6a-6b | 600 | 602 | |
| High Voltage (n) Tank | 2a-2k | 141 | 168 | 103 |
| | | 145 | 169 | |
| | | 146 | 170 | |
| | | 147 | 171 | |
| | 3a-3b | 382 | 384 | |
| | 4a-4b | 400 | 404 | |
| | 5a-5b | 500 | 502 | |
| | 6a-6b | 600 | 604 | |
| | 7a-7b | 700 | 706 | |
| Deep (n+) | 2a-2k | 147 | 171 | 104 |
| | 4a-4b | 400 | 430 | |
| | 6a-6b | 600 | 606 | |
| Low Voltage (n) Tank | 2b-2k | 139 | 175 | 106 |
| | | 144 | 176 | |
| | | 148 | 177 | |
| High Voltage (p) Tank | 2c-2k | 142 | 182 | 107 |
| | | 143 | 184 | |
| | | 144 | 180 | |
| Low Voltage (p) Tank | 2d-2k | 140 | 190 | 108 |
| | | 145 | 192 | |
| | | 149 | 186 | |
| DWELL (prior to diffusion) | 2e-2k | 146 | 194 | 109 |
| | | 147 | 196 | |
| (n+) Portion of the DWELL | 2f-2k | 146 | 159 | 110 |
| | | 147 | 163 | |
| | 3a-3b | 382 | 368 | |
| | 4a-4b | 400 | 420 | |
| | 5a-5b | 500 | 512 | |
| | 6a-6b | 600 | 620 | |
| | 7a-7b | 700 | 716 | |
| (p−) Portion of the DWELL | 2f-2k | 146 | 157 | 110 |
| | | 147 | 161 | |
| | 3a-3b | 382 | 354 | |
| | 4a-4b | 400 | 414 | |
| | 5a-5b | 500 | 510 | |
| | 6a-6b | 600 | 618 | |
| | 7a-7b | 700 | 710 | |
| Deep (p+) | 2f-2k | 146 | 200 | 111 |

TABLE 1-continued

| Structure | Figure Number | Device | Ref. Number | Process Step |
|---|---|---|---|---|
| | | 147 | 202 | |
| | 3a-3b | 382 | 356 | |
| | 4a-4b | 400 | 426 | |
| | 7a-7b | 700 | 712 | |
| Patterned Nitride Layer (moat definition) | 2h | all | 204 | 112 |
| Patterned Photoresist (channel stop def.) | 2h | all | 206 | 113 |
| Field Oxide | 2i-2k | all | 210 | 114 |
| | 3a-3b | 382 | | |
| | 4a-4b | 400 | | |
| | 5a-5b | 500 | | |
| | 6a-6b | 600 | | |
| | 7a-7b | 700 | | |
| Gate Oxide | 2i-2k | 149 | 212 | 115 |
| FAMOS gate | 2i-2k | 149 | 214 | 115 |
| Nitride/Oxide Layer | 2i-2k | 149 | 216 | 115 |
| HV Gate Oxide Layer | 2i-2k | 141 | 218 | 116 |
| | | 142 | | |
| | | 143 | | |
| | | 144 | | |
| | | 145 | | |
| | | 146 | | |
| | | 147 | | |
| | 7a-7b | 700 | | |
| HV $V_t$ Ajust | 2i-2k | 141 | 168 | 116 |
| | | 142 | 182 | |
| | | 144 | 176,180 | |
| | | 145 | 169 | |
| | | 146 | 157 | |
| | | 147 | 161 | |
| | 3a-3b | 382 | 350 | |
| | 7a-7b | 700 | | |
| LV $V_t$ Adjust | 2i-2k | 139 | 175 | 118 |
| | | 140 | 190 | |
| | 4a-4b | 400 | 412 | |
| Gate Oxide Layer | 2i-2k | 139 | 218 | 118 |
| | | 140 | 218 | |
| | 3a-3b | 382 | 370 | |
| | 4a-4b | 400 | 428 | |
| (n−) Tunnel Region | 2i-2k | 143 | 224 | 120 |
| Tunnel Oxide | 2j-2k | 143 | 226 | 120 |
| Poly Gates | 2j-2k | 139 | 228 | 122 |
| | | 140 | 230 | |
| | | 141 | 232 | |
| | | 142 | 234 | |
| | | 143 | 236,238 | |
| | | 144 | 240 | |
| | | 145 | 242 | |
| | | 146 | 244 | |
| | | 147 | 246 | |
| | | 149 | 248 | |
| | 3a-3b | 382 | 352 | |
| | 4a-4b | 400 | 410 | |
| | 7a-7b | 700 | 718 | |
| EPROM Stack | 2k | 139 | 248 | 124 |
| LDD-Source/Drains (n+/n−) | 2k | 140 | 254,256 | 126 |
| | | 142 | 258,260 | |
| | | 143 | 262,264 | |
| | | 144 | 266,268 | |
| | | 146 | 272 | |
| | | 147 | 276 | |
| | | 149 | 280,282 | |
| | 3a-3b | 382 | 394,398 | |
| | | | 358,360 | |
| | 4a-4b | 400 | 406,408 | |
| | | | 416,418 | |
| | 5a-5b | 500 | 504,506 | |
| | | | 514,516 | |
| | 6a-6b | 600 | 608,610 | |
| | | | 614,616 | |
| | 7a-7b | 700 | 702,704 | |
| | | | 708,720 | |
| Source/Drains (p+) | 2k | 139 | 284,286 | 126 |
| | | 141 | 288,290 | |
| | | 145 | 292,294 | |
| | | 146 | 296 | |
| | | 147 | 298 | |
| | 3a-3b | 382 | 362 | |
| | 4a-4b | 400 | 422 | |

TABLE 1-continued

| Structure | Figure Number | Device | Ref. Number | Process Step |
|---|---|---|---|---|
|  | 5a–5b | 500 | 415 |  |
|  | 6a–6b | 600 | 612 |  |
|  | 7a–7b | 700 | 714 |  |
| Sidewall insulator | 2k | all | 250 | 126 |
|  | 3a–3b | 382 |  |  |
|  | 4a–4b | 400 |  |  |
|  | 7a–7b | 700 |  |  |
| Cap insulator | 2k | all | 252 | 126 |
|  | 3a–3b | 382 |  |  |
|  | 4a–4b | 400 |  |  |
|  | 7a–7b | 700 |  |  |
| BPSG {borophospho-silicate glass} (only illustrated in device 148 but preferably used in all devices in all figures) | 2k | 148 | 300 | 128 |
| Orifice (only illustrated in device 148 but preferably used in all devices in all figures) | 2k | 148 | 302 | 128 |
| Contact (only illustrated in device 148 but preferably used in all devices in all figures) | 2k | 148 | 306 | 128 |
| Insulator | 2k | 148 | 304 | 128 |

FIGS. 2a–2k illustrate successive steps for forming several device types on a semiconductor substrate. A low-voltage p-channel field effect transistor 139, a low-voltage logic n-channel field effect transistor 140 (devices 139 and 140 being designed for voltages at or below about fourteen volts), a p-channel isolation or gating field-effect transistor 141 for an EEPROM array, an n-channel isolation or gating field-effect transistor 142 for an EEPROM array, electrically erasable programmable read-only memory Fowler-Nordheim tunneling cell 143, a drain-extended n-channel field effect transistor 144, a drain-extended p-channel field effect transistor 145, a lateral double-diffused "metal" oxide semiconductor (LDMOS) n-channel field effect transistor 146, a vertical double-diffused "metal" oxide semiconductor (VDMOS) n-channel field effect transistor 147, a Schottky diode 148 and a floating gate avalanche metal oxide semiconductor (FAMOS) electrically programmable read-only memory (EPROM) cell 149 may all be formed on the same integrated circuit chip. Respective device areas and the devices themselves are denoted by common numbers throughout these drawings. Devices 141–147 and 149 are designed to be subjected to voltages and/or current densities much greater than the low-voltage logic transistors 139 and 140.

While the various devices formed during this integrated process flow are shown in FIGS. 2a–2k as being closely adjacent each other, this would not necessarily be the case in the finished semiconductor chip 22. The devices are shown in close association with each other only for the reader's convenience. The reader should understand that certain of the devices can (and most likely will) be separated by wide areas on the actual semiconductor chip 22. However, viewing the various devices in close association gives an understanding of the simultaneous application of each process step to each of the devices fabricated according to the process.

Figure 3A:
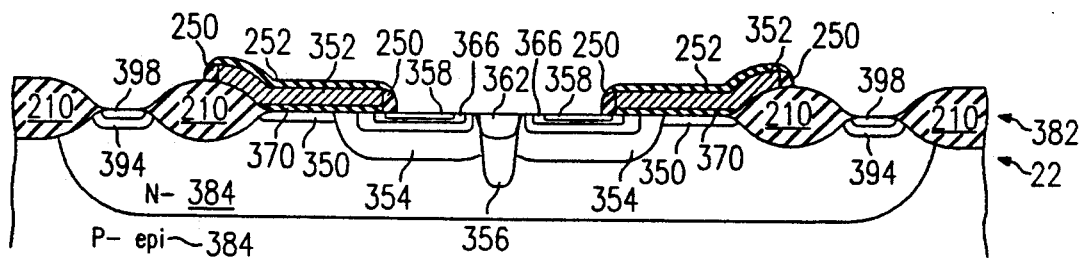
FIG. 3a is a sectional view of a lateral DMOS transistor manufactured in accordance with the process flow of FIG. 1.
Figure 3B:
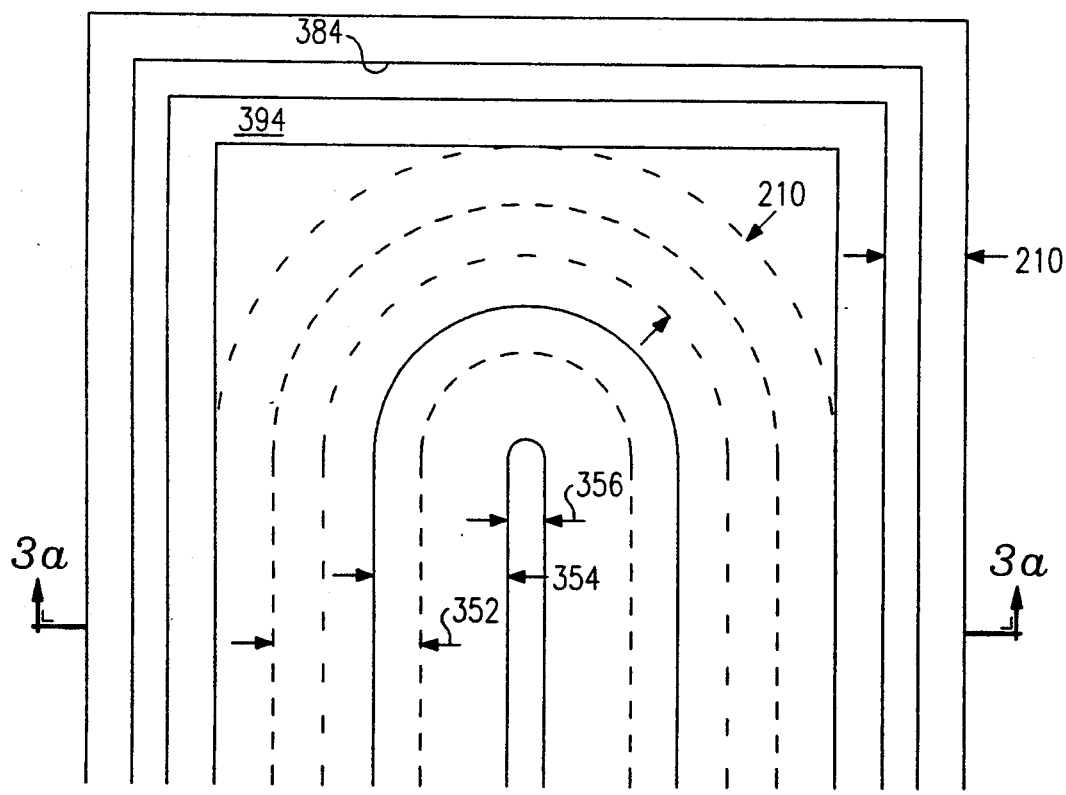
FIG. 3b is a plan view of the lateral DMOS transistor shown in FIG. 3a, FIG. 3a being taken substantially along line 3a—3a of FIG. 3b.

A more detailed view of LDMOS transistor 146 of FIGS. 2a–2k is shown in FIGS. 3a and 3b. FIG. 3a is a cross-section through the length of the transistor, while FIG. 3b shows a plan view of part of a stripe taken from the width direction of the transistor.

In the prior art, LDMOS transistors are built with DWELL implants done after poly gate etching. This gives a source structure which has the channel length (defined by boron vs. arsenic diffusion) and the gate overlap of the channel defined by diffusion, hence a self-aligned source. The LDMOS transistor fabricated in the sequence of FIGS. 2a–2k has the DWELL defined and diffused prior to poly gate deposition. This advantageously puts the high temperature processing prior to MOS isolation formation, allowing VLSI density CMOS logic transistors to be built concurrently with the LDMOS power transistor.

Like LDMOS structure 146 of FIGS. 2a–2k, the LDMOS structure 382 of FIGS. 3a–3b has a double-diffused source/backgate, giving a well controlled channel length. Gate overlap of the source depends on photoalignment, which is excellent for submicron class steppers. LDMOS transistor 382 has a (p−) region extending to the edge of the drain-side field oxide as a consequence of the blanket (unpatterned) (p−) implant used to adjust high voltage MOS threshold voltages. The (n) source/drain regions are double diffused (n+/n−). The sidewall oxide on the source side of the poly gate self aligns the heavily doped regions of the source to the gate. FIG. 3b depicts a section of a stripe of an LDMOS transistor. Not shown are contact openings to the source/drain metal. Metal 1 runs along the stripe, parallel to the gate poly. Metal 2 can run either parallel or perpendicular to the gate, depending on chip global routing to bond pads. The HV-$V_t$ adjust does not appear in the plan view since it is unpatterned. Termination of the stripes is semicircular to increase breakdown voltages.

Figure 4A:
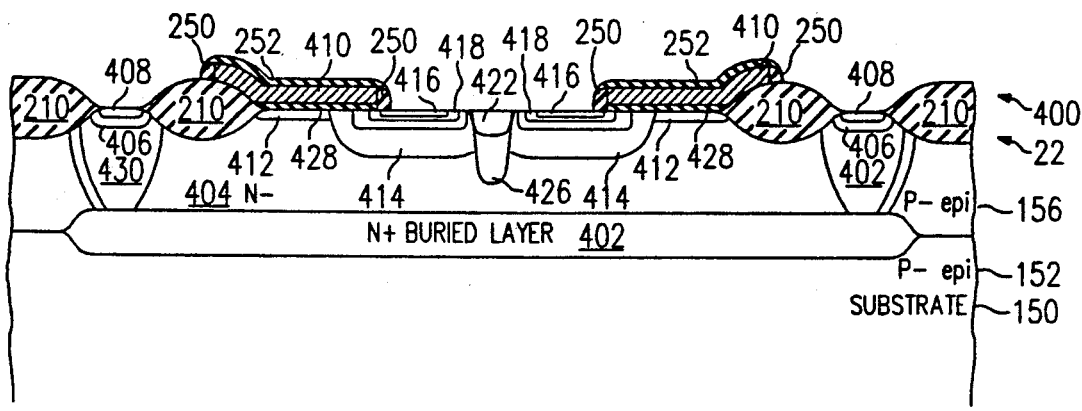
FIG. 4a is a more detailed schematic sectional view of a vertical DMOS transistor manufactured in accordance with the process flow of FIG. 1.
Figure 4B:
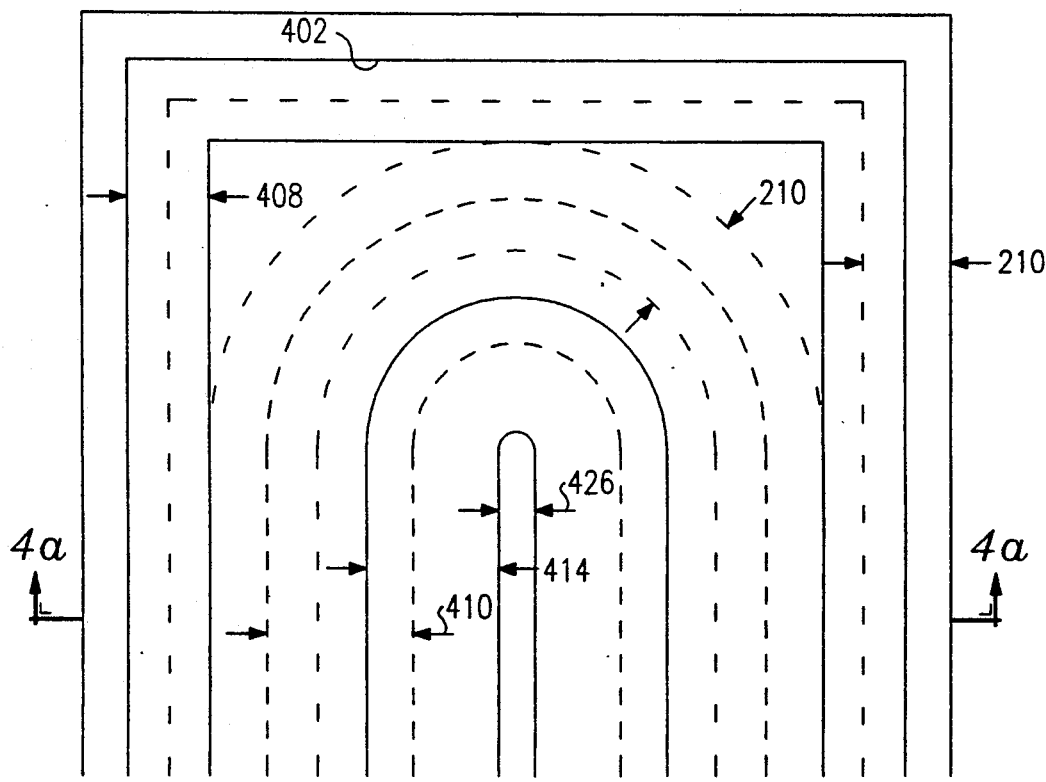
FIG. 4b is a plan view of the vertical DMOS transistor shown in FIG. 4a, FIG. 4a being taken substantially along line 4a—4a of FIG. 4b.

Vertical DMOS transistor 400 (similar to VDMOS structure 147 of FIGS. 2a–2k) is shown in detail in FIGS. 4a and 4b. The source side of the transistor is identical to that of LDMOS transistor 382 of FIG. 3a–3b. The drain side includes a deep (n+) region to connect to an (n+) buried layer. This structure gives lower resistance, $R_{DS}$(on), because of less drain resistance, and much better isolation from the substrate since the heavily doped deep (n+) regions and (n+) buried layer greatly reduce the substrate PNP action (p backgate/n HV-NTANK/p/p−substrate).

Figure 5A:
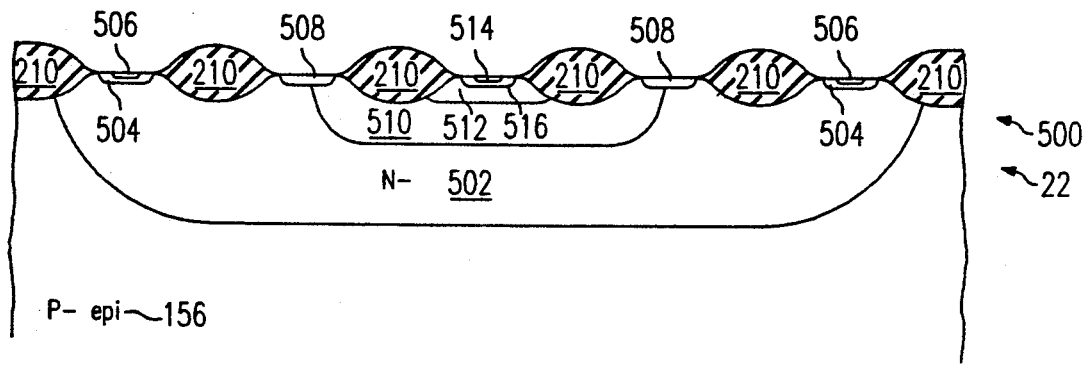
FIG. 5a is a detailed schematic sectional view of a vertical NPN transistor manufactured in accordance with the process flow of FIG. 1.
Figure 5B:
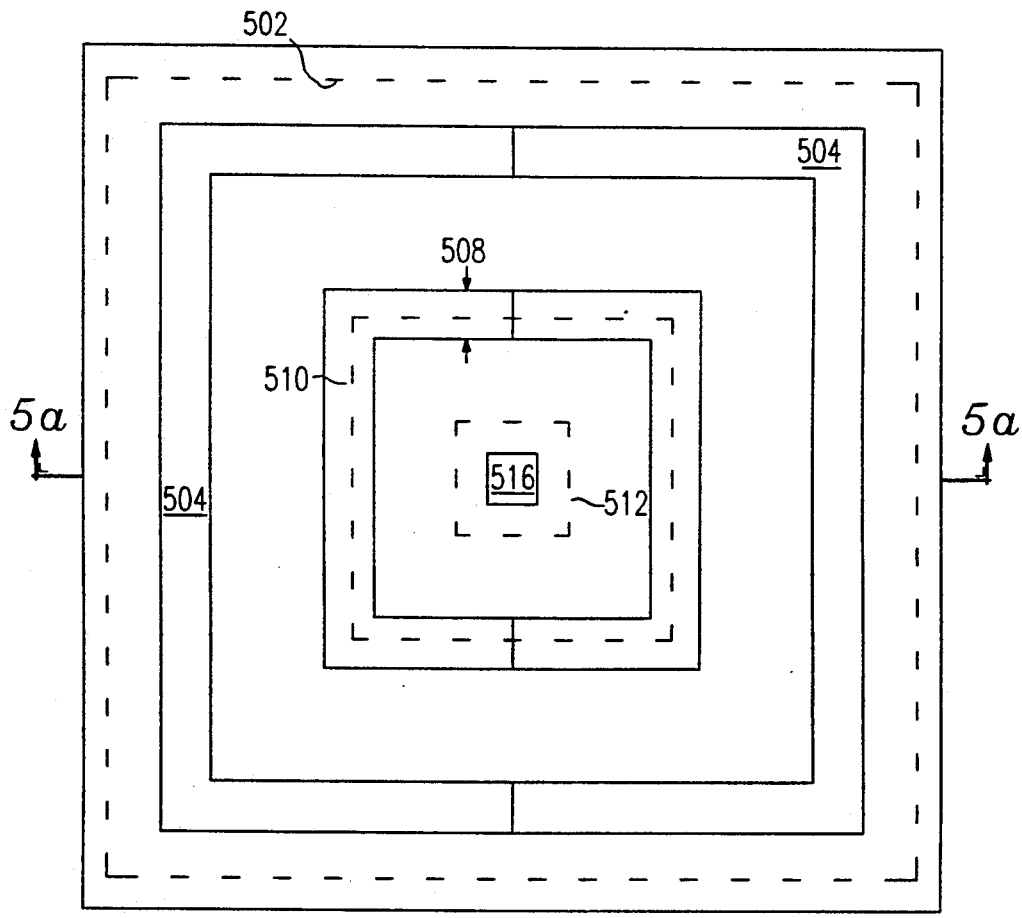
FIG. 5b is a plan view of the lateral NPN transistor shown in FIG. 5a, FIG. 5a being taken substantially along line 5a—5a of FIG. 5b.

A lateral NPN transistor is shown in detail in FIGS. 5a and 5b. Region 508 forms the base contact, region 506 forms the collector contact, and region 514 forms the emitter contact.

Figure 6A:
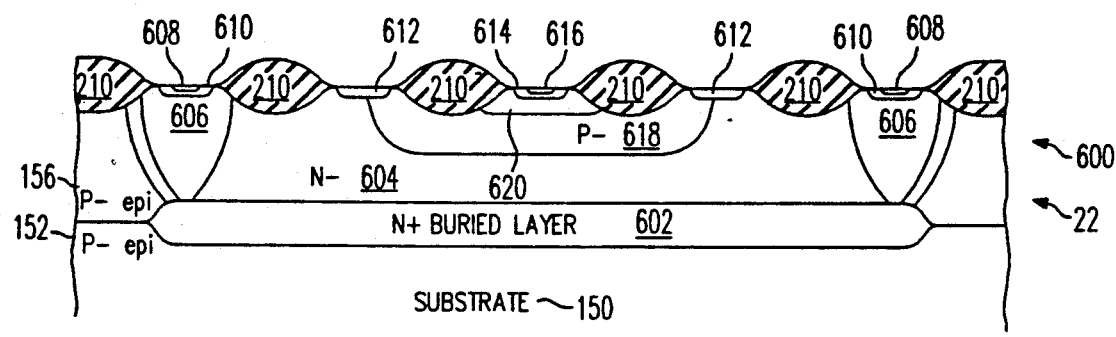
FIG. 6a is a detailed schematic view of a vertical NPN transistor with a buried layer manufactured in accordance with the process flow of FIG. 1.
Figure 6B:
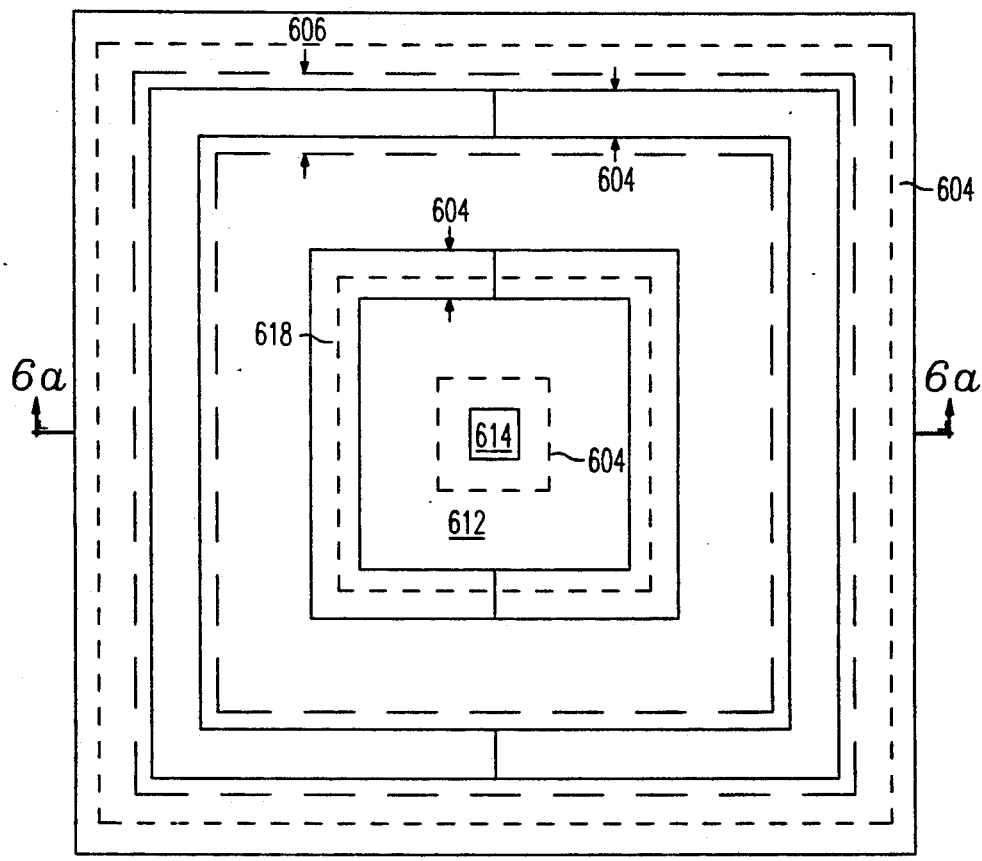
FIG. 6b is a plan view of the vertical NPN transistor shown in FIG. 6a, FIG. 6a being taken substantially along line 6a—6a of FIG. 6b.

A vertical NPN transistor is shown in detail in FIGS. 6a and 6b. Region 612 forms the base contact, region 608 forms the collector contact, and region 616 forms the emitter contact.

Figure 7A:
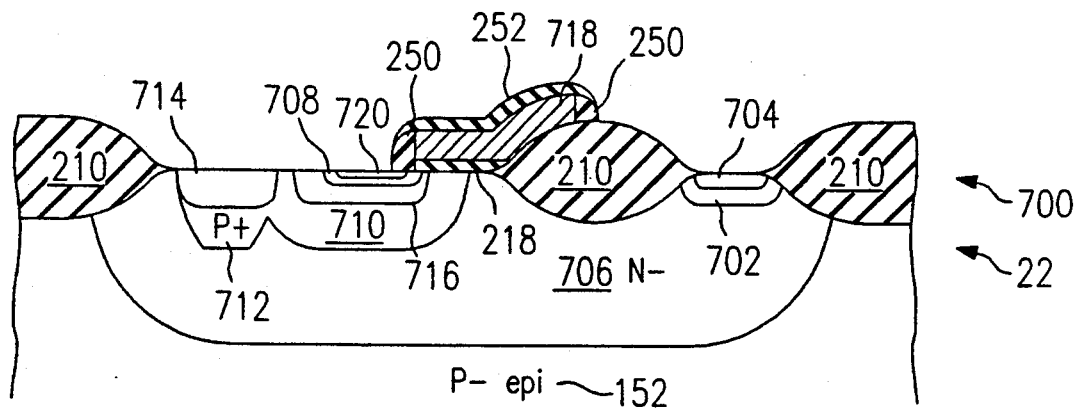
FIG. 7a is a detailed schematic sectional view of a lateral diffused MOS (LDMOS) n-channel transistor manufactured in accordance with the process flow of FIG. 1.
Figure 7B:
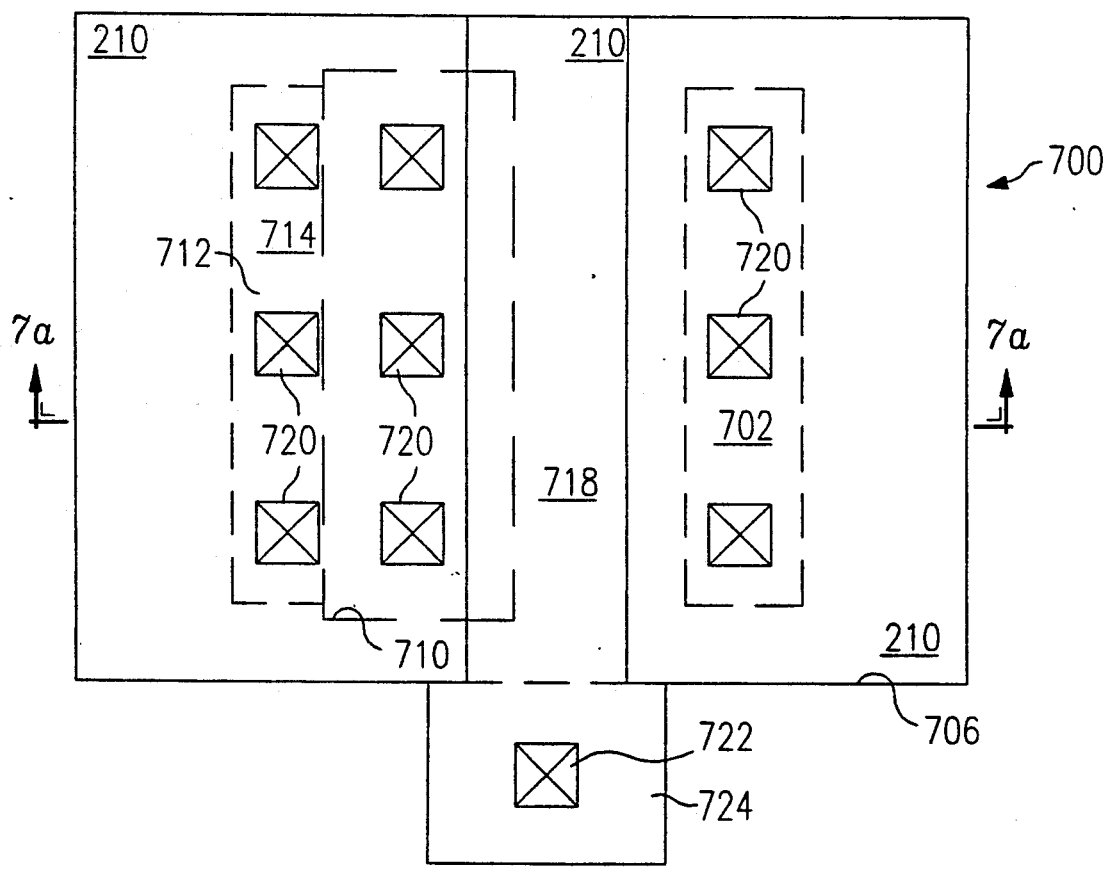
FIG. 7b is a plan view of the LDMOS transistor shown in FIG. 7a, FIG. 7a being taken substantially along line 7a—7a of FIG. 7b.

A lateral diffused MOS n-channel transistor is shown in detail in FIGS. 7a and 7b.

While the invention has been described with reference to illustrative embodiments, this description is not intended to be construed in a limiting sense. Various other embodiments will be apparent to persons skilled in the art upon reference to this description. It is therefore contemplated that the appended claims will cover any such modifications of the embodiments as fall within the true scope and spirit of the invention.

What is claimed is:

1. A method of forming a device on a semiconductor substrate, said method comprising:

selectively forming a first region of a first conductivity type in a top surface the semiconductor substrate;

subjecting said substrate to a first elevated temperature;

introducing dopants of the first conductivity type and a second conductivity type into a region in said first region, the dopants having different diffusion rates;

subjecting said substrate to a second elevated temperature thereby forming a second region within a third region, both within said first region, due to the different diffusion rates of said dopants;

forming a gate structure after said selectively forming said second region, said gate structure formed adjacent to and partially overlapping said third region; and forming first and second source/drain regions in said top surface of said semiconductor substrate, said first and second source/drain regions formed adjacent opposite ends of said gate structure.

2. The method of claim 1, wherein the step of subjecting the substrate to a first elevated temperature occurs after the step of selectively forming a first region and before the step of introducing the dopants.

3. The method of claim 1, wherein said first conductivity type is n-type.

4. The method of claim 3, wherein said second conductivity type is p-type.

5. The method of claim 4, wherein the introduction of dopants occurs by implanting an n-type dopant and a p-type dopant.

6. The method of claim 5 wherein said n-type dopant comprises arsenic and said p-type dopant comprises boron.

7. The method of claim 1, wherein said source/drain regions are formed after said formation of said gate structure.

8. The method of claim 7, wherein said first source/drain region is aligned to said gate structure.

9. The method of claim 1 wherein and further comprising the step of forming a field insulating region in said semiconductor substrate between said gate structure and second source/drain region such that said gate structure partially overlies said field insulating region.

10. The method of claim 9, where said second source/drain region is aligned to said field oxide.

11. The method of claim 9 wherein said field insulating region comprises a field oxide.

12. The method of claim 11, wherein said field oxide region is formed after said steps of introducing dopants and subjecting the substrate to a second elevated temperature, and before said formation of said gate structure.

13. The method of claim 1, wherein alignment marks are etched into said substrate for the alignment of said first region and said introduction of dopants.

14. A method of fabricating power and non-power devices on a semiconductor substrate, said method comprising:
forming alignment marks in said substrate;
introducing a dopant of a first conductivity type into the substrate to form high-voltage tank regions;
annealing the dopants;
introducing dopants of the first conductivity type and a second conductivity type in a region in the high-voltage tank region;

annealing the dopants of the first and the second conductivity type to form a second region within a third region, both within the high-voltage tank region, due to the different rates of diffusion of the dopants;

forming a gate structure after the annealing of the dopants of the first and second conductivity types, said gate structure formed adjacent to and partially overlapping said third region; and forming first and second source/drain regions in said top surface of said semiconductor substrate, said first and second source/drain regions formed adjacent opposite ends of said gate structure.

15. A method of forming an LDMOS transistor, comprising the steps of:
masking a portion of a semiconductor substrate to form an exposed region;
introducing dopants of opposite conductivity types into said exposed region, said dopants having different diffusion rates;
after the introduction of both said dopants of opposite conductivity type, annealing the dopants of opposite conductivity type thereby forming a first doped well within a second oppositely doped well; and
after forming said first well within said second well, forming a gate adjacent to and partially overlapping said first and second wells, said gate insulated from said substrate.

16. A method of fabricating power and non-power devices on a semiconductor substrate of a first conductivity type, said method comprising:
introducing dopant of a second conductivity type opposite said first conductivity type into the substrate to form high-voltage tank regions;
annealing the dopants used to form high-voltage tank regions;
introducing dopant of a second conductivity type into the substrate to form low-voltage tank regions;
introducing dopant of a first conductivity type into the substrate to form high-voltage tank regions;
introducing dopant of a first conductivity type into the substrate to form low-voltage tank regions;
introducing dopants of the first conductivity type and a second conductivity type in a region in the high-voltage tank region of said second conductivity type to form a D-well;
annealing the dopants of the first and the second conductivity type used to form high-voltage tank regions, low-voltage tank regions, and the D-well, and wherein said first and second conductivity type dopants used to form the D-well form a first dwell region within a second dwell region, both within the high-voltage tank region formed of a second conductivity type, due to the different rates of diffusion of the dopants;
forming thick gate insulating layer on portions of said substrate overlying said high-voltage tank regions of said first and second conductivity types and said first and second dwell regions;
forming thin gate insulating layer on portions of said substrate overlying said low-voltage tank regions of said first and second conductivity types;
forming gate structures on said thick and thin gate insulating layers; and
forming source and drain regions in said substrate aligned to at least one edge of said gate structures.

* * * * *